United States Patent
Miki et al.

(10) Patent No.: US 8,882,971 B2
(45) Date of Patent: Nov. 11, 2014

(54) SPUTTERING APPARATUS AND MANUFACTURING METHOD OF SEMICONDUCTOR LIGHT-EMITTING ELEMENT

(75) Inventors: Hisayuki Miki, Ichihara (JP); Kenzo Hanawa, Ichihara (JP); Yasunori Yokoyama, Ichihara (JP); Yasumasa Sasaki, Ichihara (JP)

(73) Assignee: Toyoda Gosei Co., Ltd., Aichi (JP)

( * ) Notice: Subject to any disclaimer, the term of this patent is extended or adjusted under 35 U.S.C. 154(b) by 230 days.

(21) Appl. No.: 12/987,828

(22) Filed: Jan. 10, 2011

(65) Prior Publication Data
US 2011/0198212 A1    Aug. 18, 2011

(30) Foreign Application Priority Data

Jan. 14, 2010    (JP) ................. 2010-006306

(51) Int. Cl.
C23C 14/06 (2006.01)
C23C 14/34 (2006.01)
H01L 33/00 (2010.01)
C23C 14/54 (2006.01)

(52) U.S. Cl.
CPC ............. *C23C 14/34* (2013.01); *C23C 14/0647* (2013.01); *H01L 33/007* (2013.01); *C23C 14/541* (2013.01)
USPC ............ 204/192.25; 204/298.09; 204/192.15; 427/585; 257/103; 505/475

(58) Field of Classification Search
CPC .......................... C23C 14/0617; C23C 14/541
USPC .................................................. 204/192.15
See application file for complete search history.

(56) References Cited

U.S. PATENT DOCUMENTS 5,075,094 A * 12/1991 Morrish et al. ............... 427/585
5,900,391 A *  5/1999 Sakakibara et al. ......... 505/475
(Continued)

FOREIGN PATENT DOCUMENTS

JP    59-39927 U     3/1984
JP    63-241921 A    10/1988
(Continued)

OTHER PUBLICATIONS

Morgan Advanced Ceramics, "Technical Data Sheet Pyrolytic Boron Nitride (a-PBN)", 2006.*

*Primary Examiner* — Keith Hendricks
*Assistant Examiner* — Timon Wanga
(74) *Attorney, Agent, or Firm* — Sughrue Mion, PLLC

(57) ABSTRACT

A sputtering apparatus (1) includes: a chamber (10) having an inside maintained in a depressurized state to generate plasma discharge (20); a cathode (22) placed in the chamber (10) and holding a target (21); and a substrate holder (60) holding a substrate (110) so that one surface of the substrate (110) faces the surface of the target (21). The substrate (110) is arranged at an upper portion in the sputtering apparatus (1) with the surface of the substrate (110) facing downward. The target (21) is arranged at a lower portion in the sputtering apparatus (1) with the surface of the target (21) facing upward. The sputtering apparatus (1) includes a heater (65) for heating the substrate (110). The temperature of the substrate (110) is raised by absorbing electromagnetic waves radiated from the heater (65). A method of manufacturing a semiconductor light-emitting element using the sputtering apparatus is also disclosed.

2 Claims, 6 Drawing Sheets

(56) References Cited

U.S. PATENT DOCUMENTS

| | | | |
|---|---|---|---|
| 6,143,141 A * | 11/2000 | Leverant et al. | 204/192.15 |
| 2005/0121423 A1 | 6/2005 | De Bosscher et al. | |
| 2008/0121924 A1* | 5/2008 | Miki et al. | 257/103 |
| 2009/0114534 A1* | 5/2009 | Green | 204/298.09 |
| 2010/0006430 A1 | 1/2010 | Miki et al. | |
| 2010/0213476 A1 | 8/2010 | Yokoyama et al. | |

FOREIGN PATENT DOCUMENTS

| | | |
|---|---|---|
| JP | 4-132615 A | 5/1992 |
| JP | 8-049061 A | 2/1996 |
| JP | 10-70313 A | 3/1998 |
| JP | 11-335834 A | 12/1999 |
| JP | 2001-357964 A | 12/2001 |
| JP | 2004-315861 A | 11/2004 |
| JP | 2004-335325 A | 11/2004 |
| JP | 2005-516752 A | 6/2005 |
| JP | 2006-070325 A | 3/2006 |
| JP | 2006-266827 A | 10/2006 |
| JP | 2008-109084 A | 5/2008 |
| JP | 2008-121109 A | 5/2008 |
| JP | 2008-288451 A | 11/2008 |

* cited by examiner

SPUTTERING APPARATUS AND MANUFACTURING METHOD OF SEMICONDUCTOR LIGHT-EMITTING ELEMENT

TECHNICAL FIELD

The present invention relates to a sputtering apparatus and a manufacturing method of a semiconductor light-emitting element using the same.

BACKGROUND ART

There has been a remarkable development of semiconductor light-emitting elements in recent years. In particular, a group III nitride compound semiconductor, such as gallium nitride (GaN), has become a focus of attention as a semiconductor material for short wavelength light. A group III nitride compound semiconductor is grown on a substrate made of various oxides or III-V compounds starting with sapphire single crystal.

Such a compound semiconductor is generally grown with a method such as the metal organic chemical vapor deposition (MOCVD) method, the molecular beam epitaxy (MBE) method or the hydride vapor phase epitaxy (HVPE) method.

In contrast, a sputtering (sputter) method in which particles (atoms or molecules) or the like having kinetic energy are made to collide against a substrate has been used for growth of a compound semiconductor.

Patent Document 1 describes a manufacturing method of a group III nitride compound semiconductor light-emitting element in which an intermediate layer made of at least a group III nitride compound is stacked on a substrate, and then an n-type semiconductor layer including a base layer, a light-emitting layer and a p-type semiconductor layer are sequentially stacked on the intermediate layer. The manufacturing method of a group III nitride compound semiconductor light-emitting element includes a preprocessing step for plasma processing on the substrate, and includes, following the preprocessing step, a sputtering step for forming a film of the intermediate layer on the substrate with a sputtering method.

CITATION LIST

Patent Literature

Patent Document 1: Japanese Patent Application Laid Open Publication No. 2008-109084

SUMMARY OF INVENTION

Technical Problem

In general, to form a film of a compound semiconductor having excellent crystallinity when a film of a compound semiconductor is formed with a sputtering method, it is preferable to set the temperature of a substrate at a high temperature more than 600 degrees C., for example. This is because crystallinity of the compound semiconductor is enhanced by migration of particles forming the compound semiconductor adhering to the substrate to lattice positions of the crystal by thermal motion.

However, for example, the use of sapphire for the substrate and an infrared lamp, such as a halogen lamp, for heating the substrate prevents efficient heating of the substrate because sapphire has a high transmittance to near infrared rays (0.7 µm to 2.5 µm) radiated by the infrared lamp.

An object of the present invention is to provide a sputtering apparatus whose efficiency of substrate heating is improved, and a manufacturing method of a semiconductor light-emitting element using the sputtering apparatus.

Solution to Problem

In order to attain the above object, a sputtering apparatus to which the present invention is applied includes a target placed at a lower portion in a chamber; a substrate placed at an upper portion in the chamber, the substrate being arranged in such a manner that one surface thereof faces the target; and a heating member placed above the substrate in the chamber, the heating member radiating electromagnetic waves having wavelengths including 4 µm or more, thereby to heat the substrate.

In such a sputtering apparatus, the target is any one of a group III element, a mixture including a group III element, and a compound including a group III element, and a group III nitride layer is formed on the substrate by plasma discharge generated in an atmosphere including nitrogen between the target and the substrate.

The heating member is carbon covered with pyrolytic boron nitride (PBN).

Further, the substrate is sapphire.

From another aspect of the present invention, a manufacturing method of a semiconductor light-emitting element to which the present invention is applied is as follows. In a sputtering apparatus including a target placed at a lower portion in a chamber, a substrate placed at an upper portion in the chamber, and a heating member placed above the substrate in the chamber, the target being any one of a group III element, a mixture including a group III element, and a compound including a group III element, the substrate being arranged in such a manner that one surface thereof faces the target, the method includes: a substrate heating step for heating the substrate with electromagnetic waves having wavelengths including 4 µm or more, the electromagnetic waves being radiated from the heating member; and a group III nitride layer forming step for forming a group III nitride layer on the substrate by plasma generated in an atmosphere including nitrogen between the target and the substrate.

In such a manufacturing method of a semiconductor light-emitting element, the heating member is carbon covered with pyrolytic boron nitride (PBN).

Further, the substrate is sapphire.

Advantageous Effects of Invention

According to the present invention, it is possible to provide a sputtering apparatus whose efficiency of substrate heating is improved, and a manufacturing method of a semiconductor light-emitting element using the sputtering apparatus.

DESCRIPTION OF EMBODIMENTS

Hereinafter, an exemplary embodiment of the present invention will be described in detail with reference to the accompanying drawings.

(Sputtering Apparatus 1)

Figure 1:
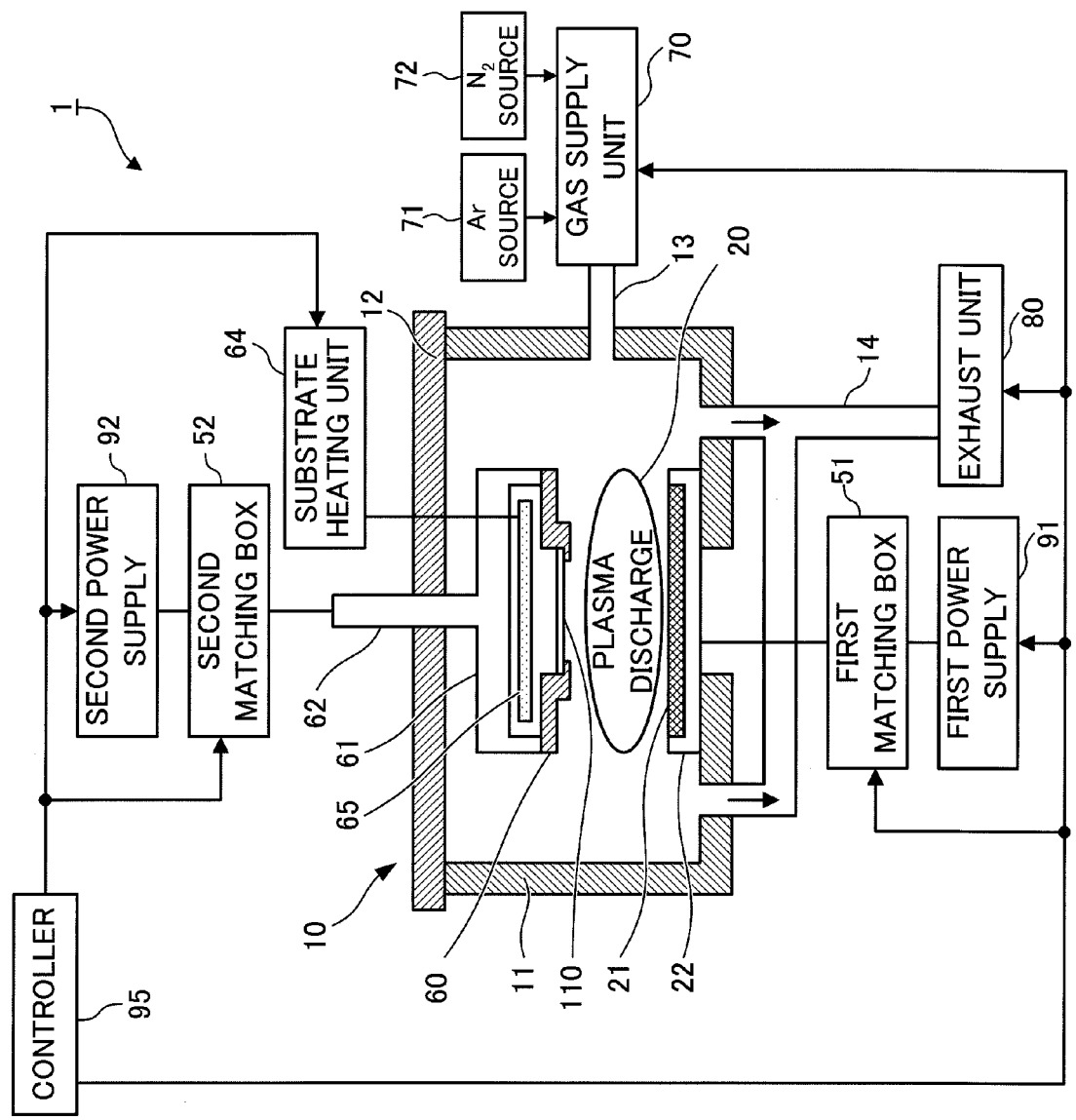
FIG. 1 is a diagram showing a cross-sectional configuration of an example of a sputtering apparatus to which the exemplary embodiment is applied.

FIG. 1 is a diagram showing a cross-sectional configuration of an example of a sputtering (sputter) apparatus 1 to which the present exemplary embodiment is applied.

The sputtering apparatus 1 includes: a chamber 10 having an inside maintained in a depressurized state to generate plasma discharge 20; a cathode 22 that is placed in the chamber 10 and holds a target 21 supplying a material of a film to be formed on a substrate 110; and a substrate holder 60 holding the substrate 110 so that one surface of the substrate 110 faces the surface of the target 21. The substrate holder 60 is held by a substrate holder holding unit 61.

As in the sputtering apparatus 1, a configuration in which the surface of the substrate 110 and that of the target 21 are arranged so as to face each other is called a parallel plate type.

In FIG. 1, the substrate 110 is arranged at an upper portion in the sputtering apparatus 1 with the surface of the substrate 110 facing downward. On the other hand, also in FIG. 1, the target 21 is arranged at a lower portion in the sputtering apparatus 1 with the surface of the target 21 facing upward. That is, employed is a so-called sputter-up configuration in which particles flying out (sputtered) upward from the surface of the target 21 below come onto the surface of the substrate 110 arranged above.

The sputter-up configuration may prevent yield reduction caused by adhesion of those fine particles to the substrate 110 which are generated by peeling-off of a film deposited on a sidewall or the like of the chamber 10.

The chamber 10 includes: a container 11 that has a cylindrical shape, is provided with an aperture facing upward and contains the target 21 therein; and a lid portion 12 that has a disk shape, is attached to an upper portion of the container 11 and holds the substrate holder holding unit 61.

The container 11 and the lid portion 12 are formed of metal such as stainless steel. The lid portion 12 is attached so as to be openable and closable with respect to the container 11, and forms the chamber 10 together with the container 11 when closed with respect to the container 11. A seal member, such as an unillustrated o-ring, is attached to a portion where the container 11 and the lid portion 12 face each other.

The container 11 and the lid portion 12 are grounded so as to be a reference of a potential.

At a center portion of the lid portion 12, a through hole for a rotation axis 62 of the substrate holder holding unit 61 to penetrate is formed. The substrate holder holding unit 61 may be configured to rotate around the rotation axis 62. Note that rotation of the substrate holder 60 together with the substrate holder holding unit 61 may improve uniformity in film thickness of a film to be formed on the substrate 110.

If the substrate holder holding unit 61 is rotated, an unillustrated axis seal formed of an o-ring or the like to hold the substrate holder 60 rotatably without inflow of the air is provided between the through hole and the rotation axis 62.

Meanwhile, on a side surface of the container 11, a supply pipe 13 to supply a gas from a gas supply unit 70 provided outside to the inside of the chamber 10 is formed to penetrate.

Additionally, on a bottom surface of the container 11, an exhaust pipe 14 is formed to penetrate, in order to exhaust the chamber 10.

On the bottom surface of the container 11, a through hole is provided to supply power to the cathode 22. The target 21 is fixed so as to be in intimate contact with the cathode 22. The cathode 22 and the container 11 are electrically isolated from each other, and fixed to each other through a seal member, such as an o-ring, so that the depressurized state may be maintained.

Furthermore, on the side surface of the container 11, a through hole (not shown) to observe the inside of the chamber 10 from outside is also formed.

The sputtering apparatus 1 includes a first matching box 51 including a first impedance matching circuit consisting of a coil and a variable capacitor so that high frequency power is efficiently supplied to the target 21. An output terminal of the first impedance matching circuit is connected to the cathode 22, and an input terminal of the first impedance matching circuit is connected to a first power supply supplying power.

In a case of direct current (DC) sputtering, direct current power may be directly supplied to the cathode 22 without providing the first matching box 51 or around the first matching box 51.

Alternatively, in a case of a magnetron sputtering system where an electron is made to perform magnetron motion by generation of a magnetic field around the target 21, thereby to form the high density plasma discharge 20, the cathode 22 may be provided with a module for magnetron sputtering made of permanent magnet (magnet) and the like.

Additionally, the sputtering apparatus 1 includes a second matching box 52 including a second impedance matching circuit consisting of a coil and a variable capacitor in order to allow for reverse sputtering (reverse sputter). An output terminal of the second impedance matching circuit is connected to the substrate holder holding unit 61. An input terminal of the second impedance matching circuit is connected to a second power supply supplying power. The reverse sputtering makes the surface of the substrate 110 exposed to the plasma discharge 20, thereby to remove organic substances and oxides adhering to the surface of the substrate 110.

If the reverse sputtering is carried out with direct current, direct current power may be directly supplied to the substrate holder 60 without involving the second impedance matching circuit.

As described above, the container 11 and the lid portion 12 of the sputtering apparatus 1 are grounded. Thus, a high frequency or direct current voltage is applied between the container 11 and the lid portion 12, and a first power supply 91 or a second power supply 92.

As shown in FIG. 1, the substrate holder 60 of the sputtering apparatus 1 includes an aperture that is cut out corresponding to the shape of the substrate 110 so that the substrate 110 is held at the periphery of the substrate 110. Attaching and detaching of the substrate 110 to and from the substrate holder 60 may be carried out by hand with the lid portion 12 opened upward in FIG. 1, or by a robot arm (not shown) in a load lock chamber provided adjacent to the chamber 10 without opening the lid portion 12. Note that a way using the robot arm is preferable because this prevents the inside of the chamber 10 from being polluted by outside air and particles coming from the outside of the chamber 10 and allows time for exhaustion to be shortened.

Furthermore, the sputtering apparatus 1 includes a heater 65 as an example of a heating member for heating the substrate 110. The sputtering apparatus 1 also includes a substrate heating unit 64 that supplies power to the heater 65 and controls the temperature of the substrate 110. In the present exemplary embodiment, the heater 65 is arranged near the backside of the substrate 110 so as to face the substrate 110 without being in contact with the substrate 110.

The heater 65 is configured by covering a resistor body 66 composed of carbon, for example, with pyrolytic boron nitride (PBN) (see FIGS. 2A and 2B to be described later). The carbon is graphite, for example. The heater 65 is heated by a current being supplied from the substrate heating unit 64 to the resistor body 66. The temperature of the substrate 110 is raised by absorbing electromagnetic waves radiated from the heater 65. The resistor body 66 of the heater 65 will be described later in detail.

The sputtering apparatus 1 includes the gas supply unit 70 supplying a gas to the chamber 10 through the supply pipe 13. In the present exemplary embodiment, the gas supply unit 70 supplies a mixed gas of argon supplied from an Ar source 71 and nitrogen supplied from an $N_2$ source 72. Since argon is an inert gas, argon and the material of the target 21 do not produce any compound. However, nitrogen reacts with the material of the target 21, thereby to produce nitride.

A method in which metal is used for the target 21 and a compound, such as nitride, is produced by reaction between metal generated by sputtering and ions or radical species of nitrogen generated by plasma is called reactive sputtering.

The sputtering apparatus 1 includes an exhaust unit 80 having a vacuum pump, such as a turbo molecular pump, a cryopump or an oil diffusion pump, and is capable of exhausting the chamber 10 through the exhaust pipe 14.

The sputtering apparatus 1 includes a controller 95 that controls operations of the first matching box 51, the second matching box 52, the substrate heating unit 64, the gas supply unit 70, the exhaust unit 80, the first power supply 91 and the second power supply 92, which are described above.

Note that the inside of the chamber 10 is set so as to have a predetermined gas pressure by control of exhaust speed by the exhaust unit 80, control of the amount of gas supply by the gas supply unit 70, and the like.

The sputtering apparatus 1 may include a shutter, which is not shown, provided so that the shutter can move to a position covering the surface of the target 21 and to a position not covering the surface of the target 21. When the shutter is in the position covering the surface of the target 21 (the shutter being closed), particles flying out (sputtered) from the target 21 are prevented from coming to the surface of the substrate 110. On the other hand, when the shutter is in the position not covering the surface of the target 21 (the shutter being opened), particles flying out (sputtered) from the target 21 come to the surface of the substrate 110, and a film is grown. That is, the shutter can set the start and end of growth of a film on the substrate 110.

Furthermore, the sputtering apparatus 1 may include a mechanism to heat or cool the target 21.

The sputtering apparatus 1 to which the present exemplary embodiment is applied is provided with one target 21 as a single target; however, two or more targets 21 may be included as multi-targets. In addition, the target 21 and the substrate 110 may be relatively moved at the time of film formation.

The sputtering apparatus 1 is of the parallel plate type, but may be of a carousel type in which a polygonal cylindrical substrate holder and a target facing the substrate holder are used and film formation is carried out while the polygonal cylindrical substrate holder is rotated around a center axis of the cylinder.

(Heater 65)

Here, the heater 65 is described in detail.

Figure 2A:
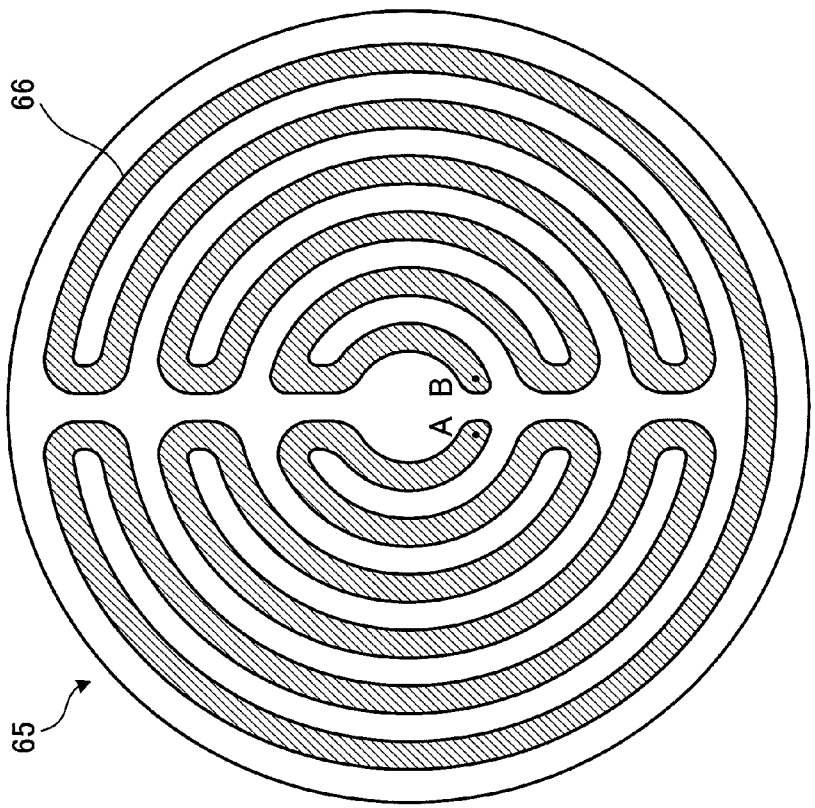
FIGS. 2A and 2B are diagrams showing an example of a surface shape of the heater applied to the exemplary embodiment.
Figure 2B:
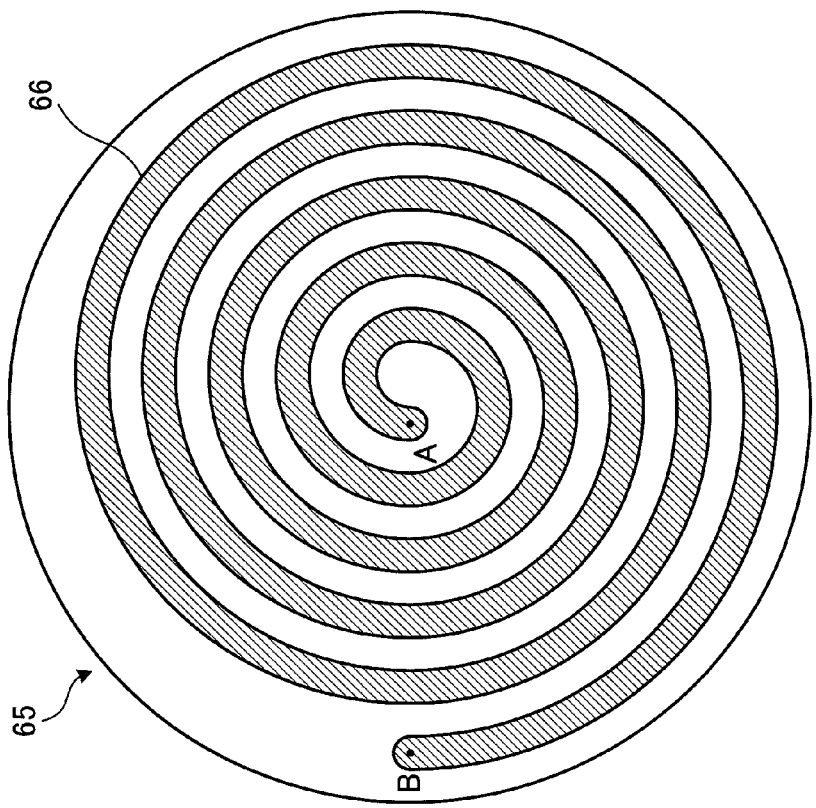

FIGS. 2A and 2B are diagrams showing an example of the heater 65 applied to the present exemplary embodiment. The heater 65 has a disk shape, and is composed of two PBN disks and the carbon resistor body 66. The carbon resistor body 66 is interposed between these two PBN disks, is formed on the internal surface of one of the disks by a printing process or the like, and has a thickness of 10 μm to 20 FIG. 2A shows a heater 65 with a resistor body 66 configured spirally. Terminals A and B are taken out from a center portion (terminal A) and an edge portion (terminal B) of the heater 65. FIG. 2B shows a heater 65 with a resistor body 66 configured to extend from a center portion to a periphery while being folded, on the left and right sides of the figure. Terminals A and B are both taken out from the center portion of the heater 65. That is, each of the heaters 65 is configured by covering the resistor body 66 with PBN.

Feeding a current (energizing) between the terminals A and B makes the resistor body 66 heated by Joule heat.

Note that the shape of the resistor body 66 of the heater 65 only needs to be able to heat the substrate 110 uniformly, and is not limited to those shown in FIGS. 2A and 2B.

Hereinafter, the heater 65 may be referred to as PBN heater.

For example, the heater 65 shown in FIG. 2B with the resistor body 66 configured to extend from a center portion to a periphery while being folded may be a heater that has an outer diameter of 6 inches and is heated up to about 600 degrees C. by feeding a current of 12 A between the terminals A and B with 50 V. In this event, the resistance value between the terminals A and B is about 4.2 Ω. Note that the outer diameter and the resistance value of the heater 65 may be selected in accordance with predetermined specification.

Figure 3:
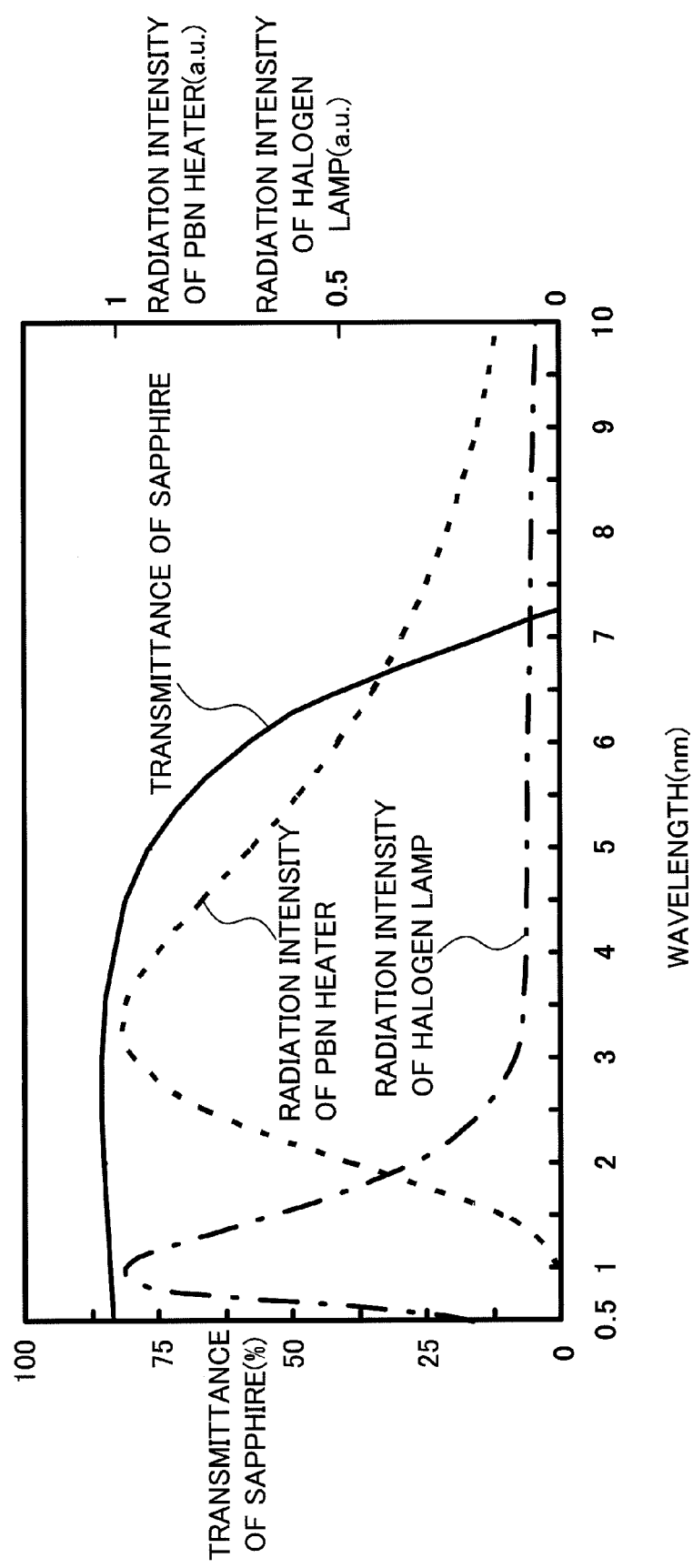
FIG. 3 is a graph showing wavelength dependence of transmittance of sapphire to electromagnetic waves and wavelength dependence of radiation intensity of electromagnetic waves of a PBN heater and a halogen lamp.

FIG. 3 is a graph showing wavelength dependence of transmittance of sapphire to electromagnetic waves (transmittance of sapphire) and wavelength dependence of radiation intensity of electromagnetic waves emitted by a PBN heater and a halogen lamp (radiation intensity of PBN heater and radiation intensity of halogen lamp). Here, sapphire is used for the substrate 110 in the present exemplary embodiment, as will be described later. The PBN heater is used for the heater 65 in the present exemplary embodiment. The halogen lamp is widely used for a heating lamp for the substrate 110 in the sputtering apparatus 1 and the like.

The vertical axis on the left side in FIG. 3 indicates transmittance of sapphire to electromagnetic waves (transmittance of sapphire) in percentage. The vertical axis on the right side indicates radiation intensity of electromagnetic waves emitted by the PBN heater and the halogen lamp (radiation intensity of PBN heater and radiation intensity of halogen lamp) in an arbitrary unit (a.u.).

Note that an electromagnetic wave having a wavelength from 0.7 μm to 2.5 μm, an electromagnetic wave having a wavelength from 2.5 μm to 4 μm, and an electromagnetic wave having a wavelength from 4 μm to 1000 μm are herein called a near infrared ray, a mid infrared ray and a far infrared ray, respectively.

Sapphire transmits an electromagnetic wave having a wavelength from the visual light range to 4 μm, at a high transmittance. Starting from a wavelength around 4 μm, sapphire becomes less able to transmit and absorbs an electromagnetic wave. Thus, when electromagnetic waves in the far infrared region having wavelengths of 4 μm or more are radiated, sapphire absorbs the electromagnetic waves and thereby is heated.

The radiation intensity of the PBN heater shown in FIG. 3 is that of electromagnetic waves when the heater is heated up to 600 degrees C. This PBN heater radiates electromagnetic waves having a peak around 3 μm. The PBN heater has high radiation intensity even in the far infrared region above 4 μm. Note that the radiation intensity of the PBN heater in the far infrared region becomes higher as the temperature of the PBN heater increases.

On the other hand, the halogen lamp radiates electromagnetic waves having a peak around 1 μm. The radiation intensity thereof rapidly decreases above 2 μm.

As described above, radiation of the PBN heater includes a high rate of electromagnetic waves in the far infrared region above 4 μm. Sapphire can be efficiently heated by causing electromagnetic waves in the far infrared region above 4 μm to be absorbed into sapphire.

On the other hand, radiation of the halogen lamp includes a low rate of electromagnetic waves in the far infrared region above 4 μm. That is, the halogen lamp is not suitable for sapphire heating by causing electromagnetic waves in the far infrared region above 4 μm to be absorbed. Thus, an indirect heating method is inevitable in which another member is placed to be in contact with the backside of the substrate 110 made of sapphire and this member is heated so as to heat the substrate 110 made of sapphire due to heat conduction. However, the contact between the substrate 110 made of sapphire and the member placed on the backside thereof is not necessarily satisfactory, which leads to the following problems: heat conduction falls short and thus heating requires longer time; non-uniform heating is caused in the surface of the substrate 110; the temperature of the substrate 110 is different every time a film is formed; and the like.

In contrast, in the present exemplary embodiment, the PBN heater efficiently radiating electromagnetic waves in the far infrared region above 4 μm is used for the heater 65, as described above. This allows for efficient heating of the substrate 110 made of sapphire and shortening of time for heating. Additionally, since the substrate 110 and the heater 65 can be arranged without coming into contact with each other, generation of particles can be prevented.

(Semiconductor Light-Emitting Element LC)

Figure 4:
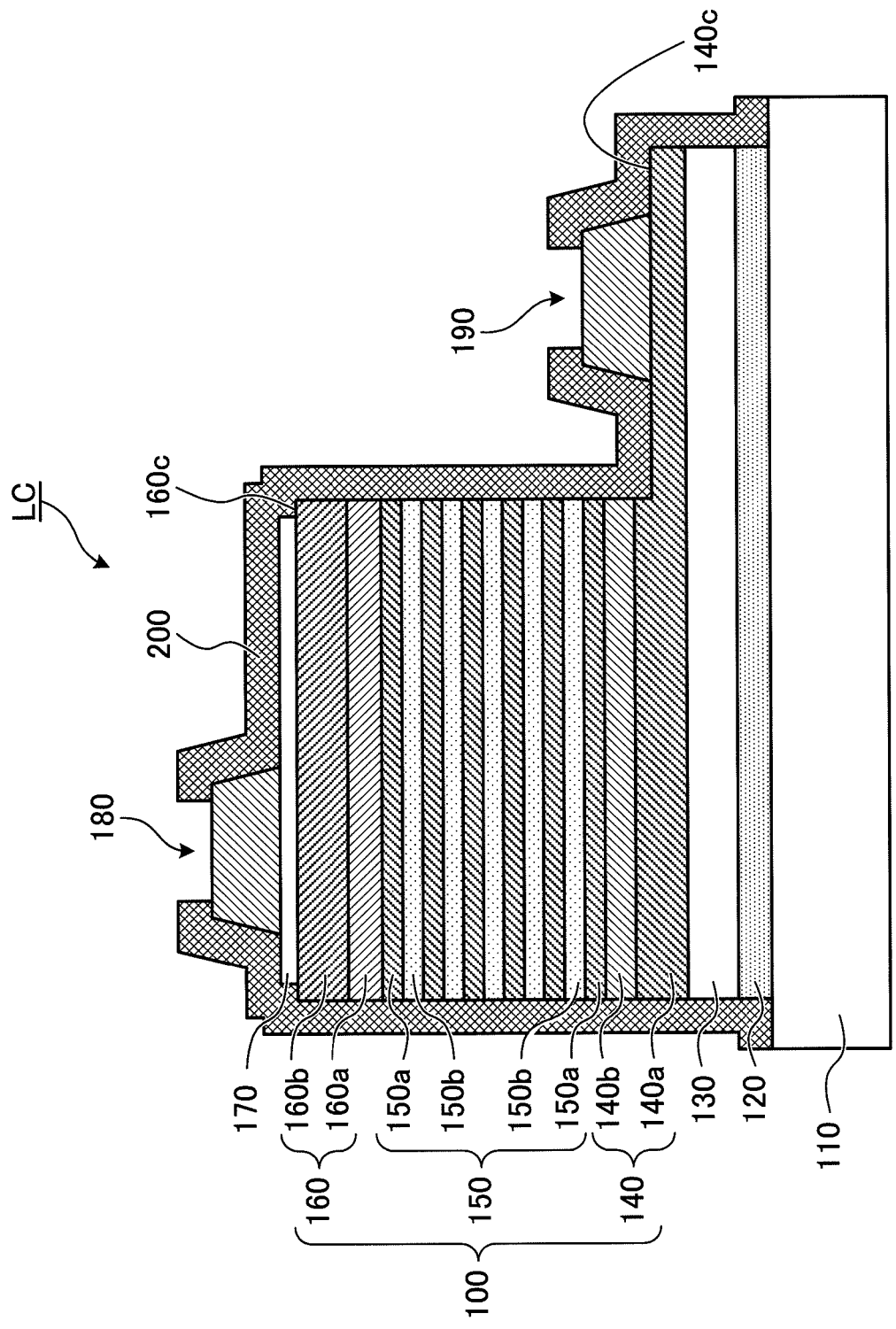
FIG. 4 is a diagram showing an example of a cross-sectional structure of a semiconductor light-emitting element manufactured by using the sputtering apparatus to which the exemplary embodiment is applied.
Figure 5:
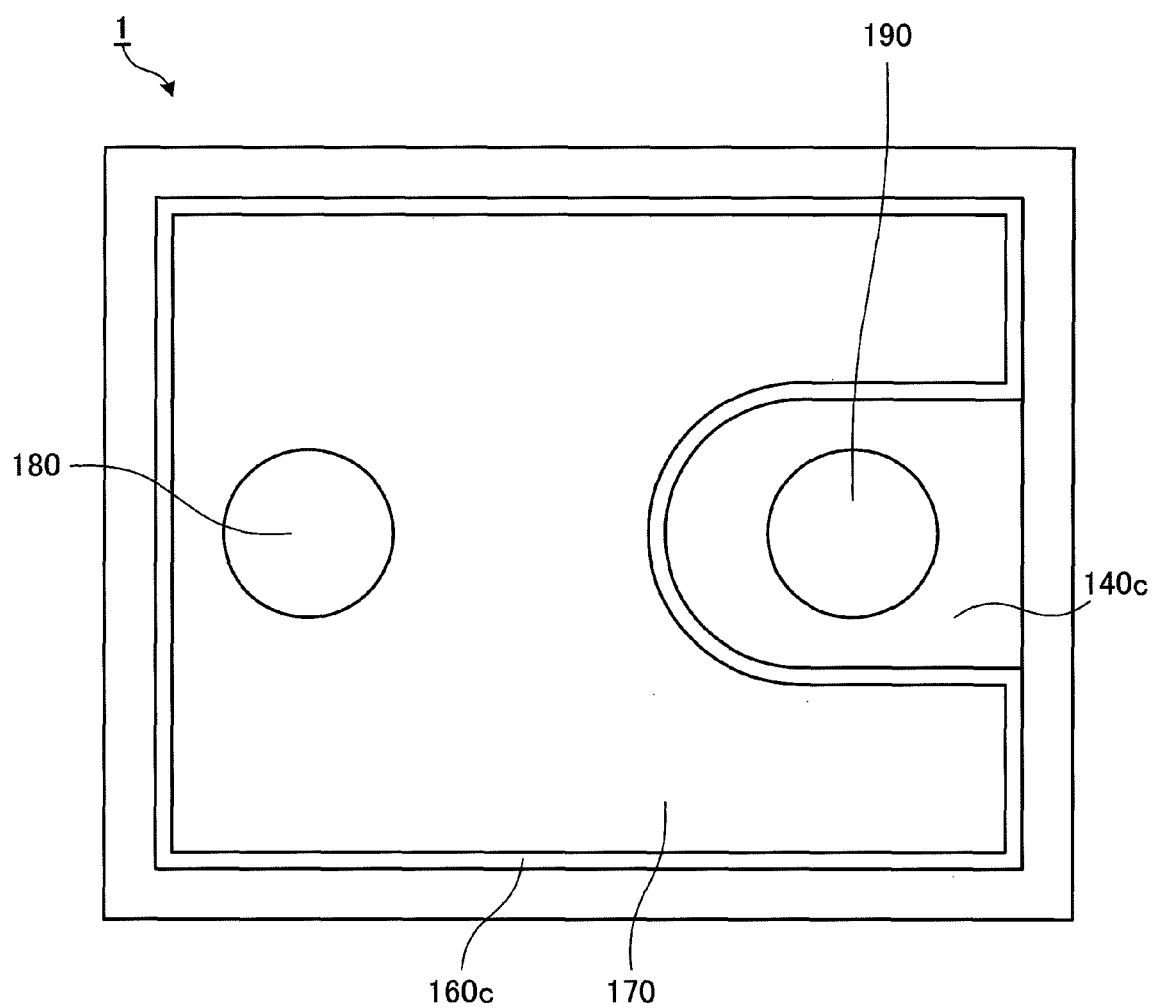
FIG. 5 is a plan view of the semiconductor light-emitting element shown in FIG. 4.

FIG. 4 is a diagram showing an example of a cross-sectional structure of a semiconductor light-emitting element LC manufactured by using the sputtering apparatus 1 to which the present exemplary embodiment is applied. FIG. 5 is a plan view of the semiconductor light-emitting element LC shown in FIG. 4.

This semiconductor light-emitting element LC is composed of a compound semiconductor. Note that a compound semiconductor forming the semiconductor light-emitting element LC is not particularly limited, and a III-V compound semiconductor, a II-VI compound semiconductor, a IV-IV compound semiconductor and the like are listed as examples thereof. In the present exemplary embodiment, a III-V compound semiconductor is preferable, and a group III nitride compound semiconductor is particularly preferable. Hereinafter, the semiconductor light-emitting element LC having a group III nitride compound semiconductor will be described as an example. The semiconductor light-emitting element LC shown in FIG. 4 as an example is a semiconductor light-emitting element LC emitting blue light.

The semiconductor light-emitting element LC includes: the substrate 110 made of sapphire; an intermediate layer 120 stacked on the substrate 110; a base layer 130 stacked on the intermediate layer 120; an n-type semiconductor layer 140 stacked on the base layer 130; a light-emitting layer 150 stacked on the n-type semiconductor layer 140; a p-type semiconductor layer 160 stacked on the light-emitting layer 150.

The n-type semiconductor layer 140 includes: an n-type contact layer 140a provided on the base layer 130 side; and an n-type clad layer 140b provided on the light-emitting layer 150 side. The light-emitting layer 150 has barrier layers 150a and well layers 150b alternately stacked, and has a structure in which two barrier layers 150a sandwiches one well layer 150b. Furthermore, the p-type semiconductor layer 160 includes: a p-type clad layer 160a provided on the light-emitting layer 150 side; and a p-type contact layer 160b provided at the uppermost layer. In the following description, the n-type semiconductor layer 140, the light-emitting layer 150 and the p-type semiconductor layer 160 will be collectively referred to as stacked semiconductor layer 100.

In the semiconductor light-emitting element LC, a transparent positive electrode 170 is stacked on the p-type contact layer 160b of the p-type semiconductor layer 160, and a positive electrode bonding pad 180 is further formed on the transparent positive electrode 170. Additionally, a negative electrode bonding pad 190 is stacked on an exposed region 140c formed in the n-type contact layer 140a of the n-type semiconductor layer 140.

Furthermore, the semiconductor light-emitting element LC includes a protective layer 200 covering the surface of the transparent positive electrode 170, the front and side surfaces of the stacked semiconductor layer 100, and the side surfaces of the base layer 130 and the intermediate layer 120 except for a part of the surfaces of the positive electrode bonding pad 180 and the negative electrode bonding pad 190.

In the semiconductor light-emitting element LC, a current flows through the stacked semiconductor layer 100 (more specifically, the p-type semiconductor layer 160, the light-emitting layer 150 and the n-type semiconductor layer 140) via the positive electrode bonding pad 180 and the negative electrode bonding pad 190, and thereby the light-emitting layer 150 emits blue light.

(Manufacturing Method of Semiconductor Light-Emitting Element LC)

First, the substrate 110 made of sapphire and having a predetermined diameter and a predetermined thickness is set in the sputtering apparatus 1 shown in FIG. 1. Then, the intermediate layer 120 and the base layer 130 are formed on the substrate 110 by the sputtering apparatus 1.

Subsequently, the n-type contact layer 140a is formed by an unillustrated MOCVD apparatus on the substrate 110, on which the base layer 130 is formed. The n-type clad layer 140b is formed on the n-type contact layer 140a. Furthermore, the light-emitting layer 150, namely, the barrier layers 150a and the well layers 150b are alternately formed on the n-type clad layer 140b. The p-type clad layer 160a is formed on the light-emitting layer 150, and the p-type contact layer 160b is formed on the p-type clad layer 160a.

Furthermore, the transparent positive electrode 170 is stacked on the p-type contact layer 160b. Additionally, the exposed region 140c is formed in the n-type contact layer 140a by etching or the like. The positive electrode bonding pad 180 and the negative electrode bonding pad 190 are provided on the transparent positive electrode 170 and the exposed region 140c, respectively.

After that, the surface of the substrate 110 opposite to the surface on which the base layer 130 is formed is ground and polished until the substrate 110 has a predetermined thickness.

The wafer in which the thickness of the substrate 110 is adjusted is then cut into a square with sides of 350 μm, for example, and thereby the semiconductor light-emitting element LC is obtained.

If the base layer 130 having excellent crystallinity can be directly formed on the substrate 110, the intermediate layer 120 may not be provided.

Hereinafter, each step will be described in turn.

<Intermediate Layer Forming Step>

First, a substrate 110 made of sapphire is prepared and subjected to preprocessing. For example, preprocessing is performed by a method in which the substrate 110 is arranged in the chamber 10 of the sputtering apparatus 1 and sputtered before the intermediate layer 120 is formed. Specifically, preprocessing may be performed in which the substrate 110 is exposed in the plasma discharge 20 of Ar and $N_2$ in the chamber 10, thereby to clean the top face thereof. Subjecting the substrate 110 to the plasma discharge 20 of Ar gas, $N_2$ gas and the like allows for removing organic substances and oxides adhering to the top face of the substrate 110.

Next, the intermediate layer 120 is stacked on the top face of the substrate 110 by the sputtering method.

When the intermediate layer 120 having a single crystal structure is formed by the sputtering method, a method is preferably employed to form a film by using the reactive sputtering method in which a group V material, such as nitrogen (nitrogen material), is circulated in the chamber 10.

In general, a flat thin film can be formed by the sputtering method. This makes it possible to form the intermediate layer 120 completely covering the surface of the substrate 110, and to improve crystallinity of the semiconductor layers stacked thereon. When a film of the intermediate layer 120 is formed by the sputtering method, it may be possible to use a group III nitride compound semiconductor as a target material being a raw material and to perform sputtering with the plasma discharge 20 of an inert gas, such as Ar gas. However, a group III nitride compound semiconductor is typically rigid, and this causes a problem such as inability to increase a film formation speed. In contrast, the use of the reactive sputtering method allows the film formation speed to improve without reducing crystallinity of the intermediate layer 120.

It is desirable to set a flow ratio of the nitrogen material to the inert gas in the chamber 10 so that the nitrogen material is from 50% to 100%, desirably 75%.

When the intermediate layer 120 having a columnar crystal (polycrystalline) structure is formed by the sputtering method, it is desirable to set a flow ratio of the nitrogen material to the flow of the inert gas in the chamber 10 so that the nitrogen material is from 1% to 50%, desirably 25%.

The temperature of the substrate 110 at the time of film formation of the intermediate layer 120, namely, the growth temperature of the intermediate layer 120 is preferably 300 degrees C. or more, more preferably 500 degrees C. or more, and most preferably 700 degrees C. or more. This is because increasing the temperature of the substrate 110 at the time of film formation of the intermediate layer 120 facilitates migration of particles (atoms or molecules), and then formation of the single crystalline or polycrystalline intermediate layer 120. Note that the temperature of the substrate 110 at the time of film formation of the intermediate layer 120 is preferably less than 1000 degrees C. in consideration of a load on the sputtering apparatus 1, and the like. A temperature of 1500 degrees C. or less, if possible, shows an improvement in crystallinity of the intermediate layer 120. However, a temperature more than 2000 degrees C., which is near the melting point of the substrate 110, is not allowed. If the temperature of the substrate 110 at the time of film formation of the intermediate layer 120 is in the above temperature range, the intermediate layer 120 having satisfactory crystallinity is obtained.

<Base Layer Forming Step>

Next, after the intermediate layer 120 is formed, the single crystalline base layer 130 is formed on the top face of the substrate 110 on which the intermediate layer 120 is formed. The film of the base layer 130 is desirably formed by the sputtering method. When the film of the base layer 130 is formed by the sputtering method, a method is preferably employed to form a film by using the reactive sputtering method in which a group V material, such as nitrogen, is circulated in the chamber 10, as with the intermediate layer 120.

The temperature of the substrate 110 at the time of film formation of the base layer 130, namely, the growth temperature of the base layer 130 is preferably 800 degrees C. or more, more preferably 900 degrees C. or more, and most preferably 1000 degrees C. or more, as with the intermediate layer 120. This is because increasing the temperature of the substrate 110 at the time of film formation of the base layer 130 facilitates migration of particles (atoms or molecules), and then growth of dislocation loops. If the temperature of the substrate 110 at the time of film formation of the base layer 130 is in the above temperature range, the base layer 130 having satisfactory crystallinity is obtained.

<N-Type Semiconductor Layer Forming Step>

After the base layer 130 is formed, the n-type contact layer 140a and the n-type clad layer 140b are stacked to form the n-type semiconductor layer 140. The n-type contact layer 140a and the n-type clad layer 140b may be formed by either of the sputtering method or the MOCVD method. Using the MOCVD method is preferable because crystallinity is more improved.

<Light-Emitting Layer Forming Step>

The light-emitting layer 150 may be formed by either of the sputtering method or the MOCVD method. In particular, the MOCVD method is preferable. Specifically, the barrier layers 150a and the well layers 150b may be alternately and repeatedly stacked, and these layers may be stacked in such an order that the barrier layers 150a are arranged on the n-type semiconductor layer 140 side and the p-type semiconductor layer 160 side.

<P-Type Semiconductor Layer Forming Step>

The p-type semiconductor layer 160 may be formed by either of the sputtering method or the MOCVD method. Specifically, the p-type clad layer 160a and the p-type contact layer 160b may be sequentially stacked.

<Transparent Positive Electrode Forming Step>

A film of a material composing the transparent positive electrode 170 is formed on the p-type semiconductor layer 160 by using a known method, such as the sputtering method, and is patterned by a known photolithography technique, thereby to form the transparent positive electrode 170.

<Exposed Region Forming Step>

Patterning is performed by a known photolithography technique, and a predetermined region of a part of the stacked semiconductor layer 100 is etched to expose a part of the n-type contact layer 140a, thereby to form the exposed region 140c.

Note that the order of the transparent positive electrode forming step and the exposed region forming step described above may be exchanged. If these are exchanged, a part of the stacked semiconductor layer 100 is etched to form the exposed region 140c, then the exposed region 140c is covered with a mask such as photoresist, and then the transparent positive electrode 170 is formed on a top face 160c of the p-type semiconductor layer 160 by using a known method such as the sputtering method.

<Electrode Forming Step>

The positive electrode bonding pad 180 and the negative electrode bonding pad 190 are formed on the transparent positive electrode 170 and the exposed region 140c, respectively.

<Protective Layer Forming Step>

The protective layer 200 made of $SiO_2$ is formed so that the surface of the transparent positive electrode 170, the front and side surfaces of the stacked semiconductor layer 100, and the side surfaces of the base layer 130 and the intermediate layer 120 are covered except for a part of the surfaces of the positive electrode bonding pad 180 and the negative electrode bonding pad 190.

<Annealing Step>

Then, annealing is performed in a reduction atmosphere, such as nitrogen, for example, between 150 degrees C. and 600 degrees C. inclusive, more preferably between 200 degrees C. and 500 degrees C. inclusive. This annealing is performed in order to enhance adhesion between the transparent positive electrode 170 and the positive electrode bonding pad 180, and between the exposed region 140c and the negative electrode bonding pad 190.

In this manner, the semiconductor light-emitting element LC shown in FIG. 4 is obtained.

If the semiconductor light-emitting element LC obtained in this manner is used for a lamp or the like, the substrate 110 is divided for each semiconductor light-emitting element LC (chip), then the substrate 110 side of each semiconductor light-emitting element LC is die-bonded to a base of the lamp, and then a bonding wire made of a gold wire is connected through a gold ball on the exposed surface of the positive electrode bonding pad 180 while a bonding wire made of a gold wire is also connected through a gold ball on the exposed surface of the negative electrode bonding pad 190. The diameter of the gold wire used here is about 10 μm to 30 μm.

Feeding a current through the semiconductor light-emitting element LC via both of the gold wires makes the light-emitting layer 150 emit light.

Now, a description is given of the operations of the sputtering apparatus 1 in the above-described manufacturing method of the semiconductor light-emitting element LC.

(Operations of Sputtering Apparatus 1)

Figure 6:
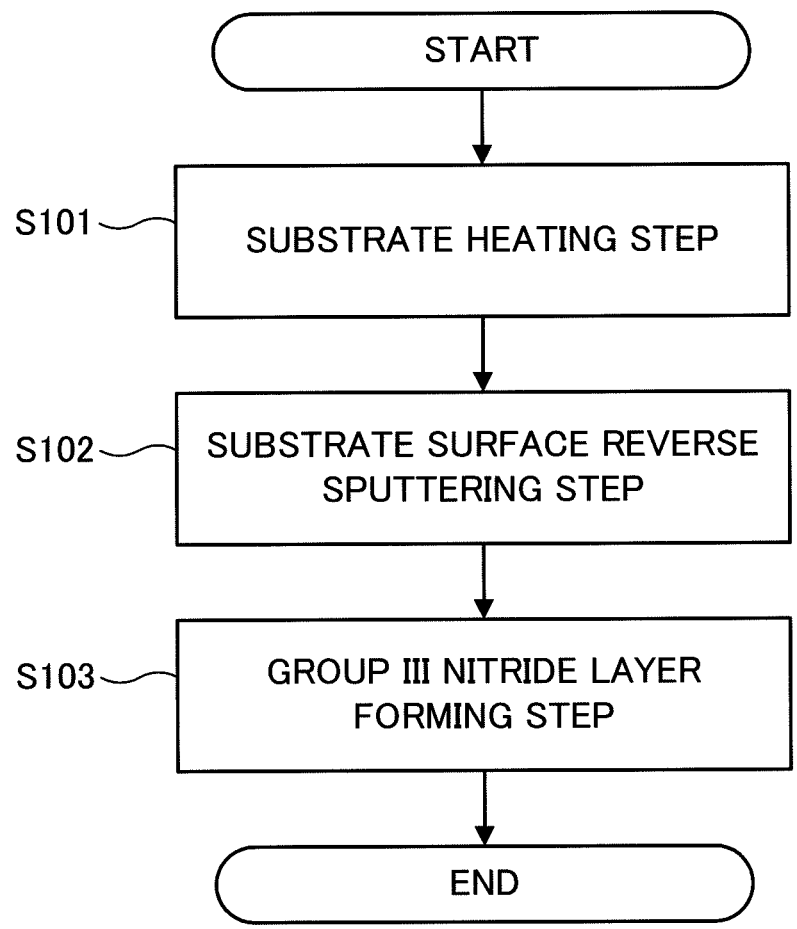
FIG. 6 is a flowchart for explaining a method to form a group III nitride compound semiconductor layer on the substrate.

FIG. 6 is a flowchart for explaining a method to form a group III nitride compound semiconductor layer on the substrate 110. Hereinafter, a description will be given of the flowchart for forming a group III nitride compound semiconductor layer, which is an example of a group III nitride layer, on the substrate 110 shown in FIG. 4, with reference to FIG. 1. The group III nitride compound semiconductor layer may be the intermediate layer 120 or the base layer 130.

In the flowchart shown in FIG. 6, it is assumed that the target 21 and the substrate 110 have already been set in the chamber 10. A substrate heating step (Step 101), a substrate surface reverse sputtering step (Step 102) and a group III nitride layer forming step (Step 103) for forming a group III nitride compound semiconductor layer are successively carried out.

Details are described below. Hereinafter, a description is given including a step for mounting the target 21 and the substrate 110 into the chamber 10.

<Target Mounting Step>

First, if the group III nitride layer to be formed on the substrate 110 is MN, a plate-like target 21 made of metal aluminum (Al) as an example of a group III element is mounted on the cathode 22.

Meanwhile, if the group III nitride layer to be formed on the substrate 110 is AlGaN, a plate-like target 21 made of AlGa compound as an example of a compound including a group III element is mounted on the cathode 22. Note that the target 21 may be a sintered mixture of metal aluminum (Al) and metal gallium (Ga), which is an example of a mixture including a group III element.

Furthermore, if the group III nitride layer to be formed on the substrate 110 is AlGaInN, a plate-like target 21 made of AlGaIn compound as an example of a compound including a group III element is mounted on the cathode 22. Note that the target 21 may be a sintered mixture of metal aluminum (Al), metal gallium (Ga) and metal indium (In), which is an example of a mixture including a group III element.

<Substrate Mounting Step>

Then, the substrate 110 made of sapphire and having a predetermined diameter and a predetermined thickness is set to the substrate holder 60 by hand with the lid portion 12 of the sputtering apparatus 1 opened or by a robot arm without opening the lid portion 12 so that the surface of the substrate 110 on which a group III nitride compound semiconductor layer is to be formed is exposed from the aperture of the substrate holder 60.

Then, the chamber 10 of the sputtering apparatus 1 is exhausted by the exhaust unit 80, until the chamber 10 has a predetermined degree of vacuum.

<Substrate Heating Step>

A current is supplied to the heater 65 by the substrate heating unit 64, and the temperature of the substrate 110 is set at a predetermined temperature (Step 101). For example, a temperature from 500 degrees C. to 800 degrees C. may be used as the temperature of the substrate 110.

The temperature of the substrate 110 is controlled on the basis of a temperature measured by a temperature measurement unit, such as a thermocouple, installed near the heater 65. The temperature of the substrate 110 is difficult to directly measure, but can be calibrated by preliminary experiment using the substrate 110 with a thermocouple attached in advance.

<Substrate Surface Reverse Sputtering Step>

Next, a predetermined flow amount of nitrogen is supplied into the chamber 10 by the gas supply unit 70. The exhaust speed is adjusted by the exhaust unit 80, and thereby the inside of the chamber 10 is set so as to have a predetermined gas pressure.

Then, in order to remove absorbed gas, stain and the like on the surface of the substrate 110, high frequency power is supplied to the substrate holder 60 by the second power supply 92, and the surface of the substrate 110 on the substrate holder 60 is subjected to sputtering (reverse sputtering) for a predetermined time period (Step 102).

The reverse sputtering is preferably performed only with nitrogen, without mixing argon, which has a large mass, in order to prevent the surface of the substrate 110 from being roughed.

Also in this substrate surface reverse sputtering step, the substrate 110 is controlled by the substrate heating unit 64 so as to be in a predetermined temperature range.

<Group III Nitride Layer Forming Step>

Next, a predetermined flow amount of argon and nitrogen is supplied into the chamber 10 by the gas supply unit 70. The exhaust speed is adjusted by the exhaust unit 80, and thereby the inside of the chamber 10 is set so as to have a predetermined gas pressure. For example, the flow amount of argon may be set at 2 sccm, and that of nitrogen may be set at 50 sccm to 100 sccm. The flow amount of nitrogen may not be the same as the one in the case of the above-described reverse sputtering. Since nitrogen is a reaction gas to form a group III nitride compound semiconductor layer, nitrogen cannot be set at 0%, but may be set at 100%.

Then, predetermined high frequency power is supplied from the first power supply 91 to the target 21 while the shutter is closed, and thereby the plasma discharge 20 is generated around the surface of the target 21.

When the plasma discharge 20 is stabilized, the shutter is opened to form a group III nitride compound semiconductor layer on the surface of the substrate 110 (Step 103).

Note that also in this group III nitride layer forming step, the substrate 110 is controlled by the substrate heating unit 64 so as to be in a predetermined temperature range.

When a group III nitride compound semiconductor layer having a predetermined film thickness is formed, the shutter is closed and then formation of the group III nitride compound semiconductor layer is finished. The thickness of the group III nitride compound semiconductor layer may be controlled according to film formation time (a time period from shutter opening to shutter closing), on the basis of a relationship between a thickness and formation time that are obtained when film formation is performed in advance.

After that, the plasma discharge 20 is stopped, and the gas is exhausted from the chamber 10. Next, the process waits until the temperature of the substrate 110 changes to such a degree that the substrate 110 can be taken out from the chamber 10. The substrate 110 on which the group III nitride compound semiconductor layer is formed is taken out from the chamber 10 by opening the lid portion 12 after returning the inside of the chamber 10 to the atmospheric pressure by, for example, the gas supply unit 70 supplying nitrogen into the chamber 10, or by a robot arm without returning the inside of the chamber 10 to the atmospheric pressure.

As described above, a group III nitride compound semiconductor layer is formed on the substrate 110 by the sputtering apparatus 1.

If the above group III nitride compound semiconductor layer is the intermediate layer 120 and further the base layer 130 is formed by the sputtering apparatus 1 so as to be stacked on the intermediate layer 120, then the above manufacturing method may be repeated with another target 21 adapted to the base layer 130.

Then, the semiconductor light-emitting element LC shown in FIG. 4 is manufactured through the above-described manufacturing method of the semiconductor light-emitting element LC.

In the above-described manufacturing method of the semiconductor light-emitting element LC, a description has been given assuming that the group III nitride compound semiconductor layer is the intermediate layer 120 or the base layer 130. The n-type semiconductor layer 140, the light-emitting layer 150 and the p-type semiconductor layer 160, which are subsequent to the these layers, may also be formed through a procedure similar to the one described above, by using the sputtering apparatus 1.

Note that the substrate 110 herein shall include not only a substrate 110 made of sapphire but also a substrate 110 on which layers up to either of the intermediate layer 120, the base layer 130, the n-type semiconductor layer 140, the light-emitting layer 150, the p-type semiconductor layer 160 or the like are sequentially stacked.

The invention claimed is:

1. A manufacturing method of a semiconductor light-emitting element in a sputtering apparatus including a target placed at a lower portion in a chamber, a substrate placed at an upper portion in the chamber, and a heating member placed above the substrate in the chamber, the target being any one of a group III element, a mixture including a group III element, and a compound including a group III element, the substrate being arranged in such a manner that one surface thereof faces the target, the method comprising:

a substrate heating step for heating the substrate, the substrate being heated by absorbing electromagnetic waves having wavelengths including 4 μm or more, the electromagnetic waves being radiated from the heating member; and a group III nitride layer forming step for forming a group III nitride layer on the heated substrate by plasma generated in an atmosphere including nitrogen between the target and the substrate, wherein the substrate is sapphire, and wherein a temperature to which the substrate is heated by absorbing the electromagnetic waves is 500 degrees C. or more and less than 1500 degrees C.

2. The manufacturing method of a semiconductor light-emitting element according to claim 1, wherein the heating member is carbon covered with pyrolytic boron nitride (PBN).

* * * * *